(12) United States Patent
Shinada et al.

(10) Patent No.: US 9,368,331 B2
(45) Date of Patent: Jun. 14, 2016

(54) SPUTTERING APPARATUS

(71) Applicant: CANON ANELVA CORPORATION, Kawasaki-shi (JP)

(72) Inventors: Masato Shinada, Kawasaki (JP); Keisuke Ueda, Kawasaki (JP)

(73) Assignee: Canon Anelva Corporation, Kawasaki-shi (JP)

( * ) Notice: Subject to any disclaimer, the term of this patent is extended or adjusted under 35 U.S.C. 154(b) by 0 days.

(21) Appl. No.: 14/751,595

(22) Filed: Jun. 26, 2015

(65) Prior Publication Data

US 2015/0303042 A1 Oct. 22, 2015

Related U.S. Application Data

(63) Continuation of application No. PCT/JP2013/006789, filed on Nov. 19, 2013.

(30) Foreign Application Priority Data

Feb. 28, 2013 (JP) .................. 2013-039310

(51) Int. Cl.
*H01J 37/34* (2006.01)
*C23C 14/35* (2006.01)
*H01J 37/32* (2006.01)

(52) U.S. Cl.
CPC ............ *H01J 37/3441* (2013.01); *C23C 14/35* (2013.01); *H01J 37/32651* (2013.01); *H01J 37/3405* (2013.01); *H01J 37/3417* (2013.01); *H01J 37/3461* (2013.01)

(58) Field of Classification Search
CPC ............ H01J 37/32651; H01J 37/3441; H01J 37/3447; H01J 37/345; H01J 37/3452; H01J 37/3461; H01J 37/3402; H01J 37/3405; H01J 37/3408
USPC ....................................... 204/298.11
See application file for complete search history.

(56) References Cited

U.S. PATENT DOCUMENTS

| 5,047,130 A | 9/1991 | Akao et al. |
| 9,127,355 B2 | 9/2015 | Nakazawa et al. |
| 2014/0261182 A1 | 9/2014 | Nakazawa et al. |

FOREIGN PATENT DOCUMENTS

| JP | 62-114058 U | 7/1987 |
| JP | 2-107766 A | 4/1990 |
| JP | 2009-293089 A | 12/2009 |
| JP | 2012-62573 A | 3/2012 |
| JP | 2012-111996 A | 6/2012 |
| JP | 2013-147711 A | 8/2013 |

OTHER PUBLICATIONS

International Search Report issued in PCT/JP2013/006789, dated Feb. 18, 2014 (2 pages).

*Primary Examiner* — Rodney McDonald
(74) *Attorney, Agent, or Firm* — Fitzpatrick, Cella, Harper & Scinto

(57) ABSTRACT

The present invention provides a highly efficient magnetron sputtering apparatus in which a ground shield made of a magnetic material is disposed on the outer circumference of a target, the sputtering apparatus being capable of reducing unintended discharge between a cathode and the ground shield. The sputtering apparatus according to an embodiment includes: a backing plate connected to a power supply and having a target mounting surface; a magnet disposed on the back surface of the backing plate; a grounded shield containing a magnetic material and surrounding the target mounting surface; and a fixation part located between the shield and the backing plate at an outer circumference of the target mounting surface and serving as a magnetic member. This structure reduces magnetic field lines which pass through a space between the shield and the fixation part.

5 Claims, 3 Drawing Sheets

SPUTTERING APPARATUS

CROSS-REFERENCES TO RELATED APPLICATIONS

This application is a continuation application of International Application No. PCT/JP2013/006789, filed Nov. 19, 2013, which claims the benefit of Japanese Patent Application No. 2013-039310 filed Feb. 28, 2013. The contents of the aforementioned applications are incorporated herein by reference in their entireties.

TECHNICAL FIELD

The present invention relates to a sputtering apparatus.

BACKGROUND ART

In manufacturing of integrated circuits, display panels, disks and the like, sputtering (hereinafter also referred to as sputter) is widely used to form a film on a substrate such as a semiconductor wafer, a glass panel, and a resin disk. Sputter is a film formation technique in which ions collide with the surface of a target, and thereby particles are ejected from the surface and are deposited on a substrate to form a film. The target is fixed to a backing plate. The backing plate is cooled by a cooling means, thereby cooling the target. The backing plate also functions as an electrode that applies a voltage to the target.

In order to perform sputter efficiently, a magnetron sputter is widely used in which a magnet is disposed on the back surface of the target. In the magnetron sputter, a voltage is applied to a target to form plasma formed in an area near the target, and the plasma thus formed is confined to the area near the target by a magnetic field, so that the sputter can be performed efficiently. A configuration is proposed in which a shield enclosing the outer circumference of the target is grounded (hereinafter also referred to as ground shield) to serve as an anode whereas the target and the backing plate function as a cathode under application of a voltage (Patent Document 1). In addition, Patent Document 1 discloses that the shield is made of a magnetic material, thereby further confining the plasma to the area near the target.

CITATION LIST

Patent Document

Patent Document 1: Japanese Patent Application Laid-Open No. 2009-293089

SUMMARY OF INVENTION

FIG. 5 is a diagram created by the inventor of the present application for explaining an object of the invention of the present application. FIG. 5 schematically illustrates an area around the target 5 in a sputtering apparatus. The sputtering apparatus includes a backing plate 7, a fixation part 13 that fixes the target 5 to the backing plate 7, and a shield 14 that surrounds the target 5. The fixation part 13 may be fixed to the backing plate 7 by a screw or the like so as to press the target 5 against the backing plate 7. The shield 14 may be disposed around the target 5 so as to cover the fixation part 13. The back surface side of the backing plate 7 (the side of the backing plate 7 opposite to the side on which the target 5 is disposed) is provided with a magnetron unit 8 that serves as a magnetic field generating means. The magnetron unit 8 includes an annular outside magnet 8a and an inside magnet 8b provided inwardly of the outside magnet 8a. The outside magnet 8a and the inside magnet 8b are provided on a yoke 8c. In FIG. 5, the surface of the outside magnet 8a facing the backing plate 7 is magnetized to the N pole, and the surface of the inside magnet 8b facing the backing plate 7 is magnetized to the S pole. The backing plate 7 is connected to a power supply. When a voltage is applied to the backing plate 7 and the target 5 by the power supply, a plasma is formed in the area near the target 5.

When the shield 14 is made of a magnetic material, part of magnetic field lines ML from the outside magnet 8a flows into the magnetic shield 14. The plasma is confined to an area nearer to the target 5 by a magnetic tunnel which is formed by the magnetron unit 8 and the shield 14 like this, and the target 5 can be efficiently sputtered.

However, at this point, part of the magnetic field lines ML does not enter the shield 14, but flows along the shield 14 into the yoke 8c and enters the opposite side of the outside magnet 8a. Here, the shield 14 is grounded whereas a voltage from the power supply is applied to the backing plate 7 and the fixation part 13. Thus, a voltage difference is generated between these members. The magnetic field lines ML along the shield 14 attract ions from the plasma formed near the target 5 into the space between the shield 14 and the backing plate 7 or the fixation part 13, and thus unintended discharge may be caused in the space. This abnormal discharge may cause a damage to the backing plate 7 or the fixation part 13, the inner side of the shield 14, or the like, and may resultantly generate a pollution source of a substrate. For this reason, it is desirable to suppress occurrence of abnormal discharge as much as possible.

Such a problem is particularly conspicuous in high frequency sputter with high ion density in a plasma.

The present invention has been made in view of the above-described problem as an impetus, and has an object to provide a highly efficient magnetron sputtering apparatus including a ground shield made of a magnetic material and disposed on the outer circumference of a target, the sputtering apparatus being capable of reducing unintended discharge between a cathode and the ground shield.

A first aspect of the present invention provides a sputtering apparatus including: a substrate holding unit configured to hold a substrate; a backing plate having a target mounting surface where to hold a target; a power supply connected to the backing plate; a magnet disposed on a side of the backing plate opposite to the target mounting surface of the backing plate; a shield containing a magnetic material, being grounded, and surrounding the target mounting surface; and a magnetic member located between the shield and the backing plate at an outer circumference of the target mounting surface and provided at a position not facing the magnet in a direction perpendicular to the target mounting surface.

ADVANTAGEOUS EFFECTS OF INVENTION

By using the present invention, unintended discharge between the cathode and the ground shield can be reduced in a highly efficient magnetron sputtering apparatus in which a ground shield made of a magnetic material is disposed on the outer circumference of a target.

DESCRIPTION OF EMBODIMENTS

Although a particular embodiment in the present invention will be described with reference to the accompanying drawings hereinafter, this is not intended to limit the present invention.

Figure 1:
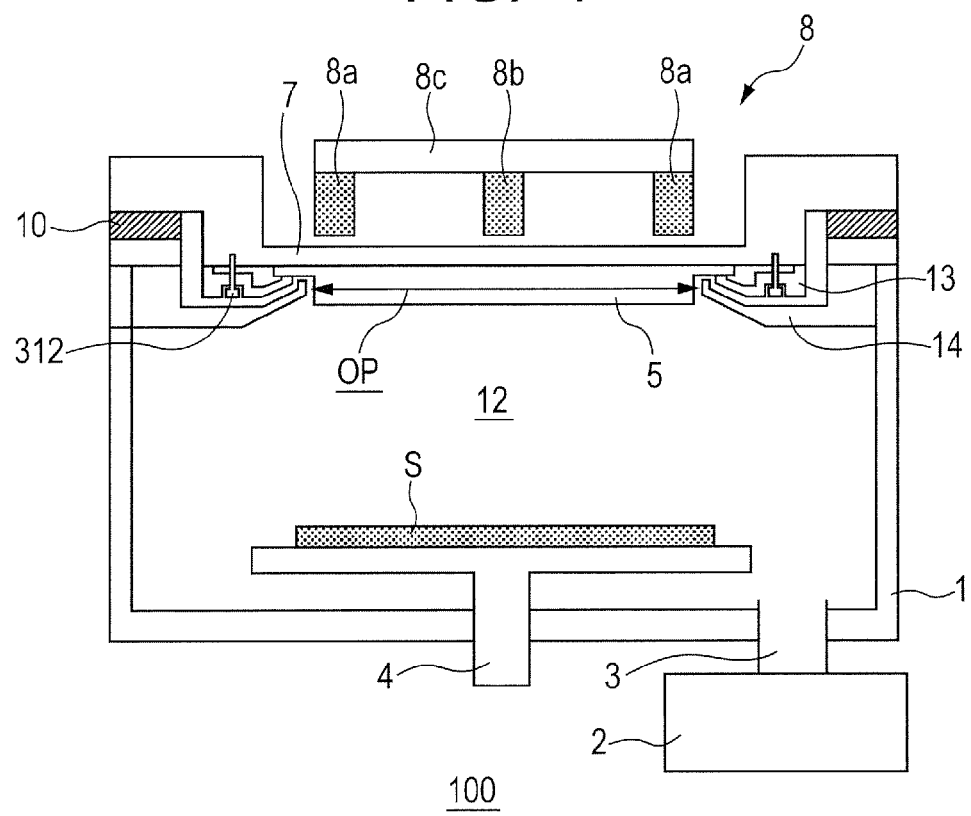
FIG. 1 is a diagram illustrating the basic configuration of a sputtering apparatus in an embodiment of the present invention.

First, the basic configuration of a sputtering apparatus in an embodiment of the present invention will be described with reference to FIG. 1. A sputtering apparatus 100 in an embodiment of the present invention has a backing plate 7, a fixation part 13 that is a magnetic member and fixes a target 5 to the backing plate 7, and a shield 14 surrounding the target 5. The fixation part 13 is fixed to the backing plate 7 by a fastening part 312 such as a screw so as to press the target 5 against the backing plate 7. The backing plate 7 may have a conductive sheet with the objective of thermal conductivity. The target 5 is exposed to the plasma which is generated by discharge, and thus has an increased temperature and may expand. Thus, it is desirable that the fixation part 13 fix the target 5 so as to allow the target 5 to expand. The shield 14 is disposed around the target 5 so as to cover the fixation part 13. This restricts an increase in the temperature of the fixation part 13. The backing plate 7 is fixed to a chamber wall 1 via an insulation member 10. The backing plate 7 and the chamber wall 1 constitute a processing container. The backing plate 7 is connected to a power supply for discharge, which is not illustrated, and is configured to receive an applied voltage necessary for sputtering. Any one of a DC power supply and a high frequency power supply is applicable as a power supply for discharge. A voltage is applied to the fixation part 13 as well as the backing plate 7. The shield 14 is electrically grounded and functions as the anode when a plasma is formed near the target 5.

The sputtering apparatus 100 is configured to form a film on a substrate S by sputtering in a process space 12 that is isolated from an external space by the chamber wall 1. Specifically, the target 5 is bombarded with ions generated by discharge caused by a voltage applied between across a substrate holding unit 4 that holds the substrate S and the backing plates 7, and thereby particles are ejected from the target 5. Those particles are deposited on the substrate S, thereby forming a film on the substrate S. The particles from the target 5 are deposited on the shield 14 in addition to the substrate S, and a deposition may be formed. The process space 12 is evacuated and decompressed by an air exhauster 2 such as a turbo-molecular pump through an exhaust port 3 provided in the chamber wall 1. Sputtering gas (for instance, argon) is introduced into the process space 12 through a gas supply unit which is not illustrated.

The sputtering apparatus 100 includes a magnetron unit 8 that provides a magnetic field around the target 5, and is formed as a magnetron sputtering apparatus. The magnetron unit 8 is disposed so that the backing plate 7 is interposed between the magnetron unit 8 and the target 5. Although the entire target 5 may be made of a target material, the target 5 may have a configuration in which the target material is bonded by soldering or the like onto a plate member (for instance, a plate member made of an oxygen-free copper) which is in contact with the backing plate 7, for instance.

Figure 2:
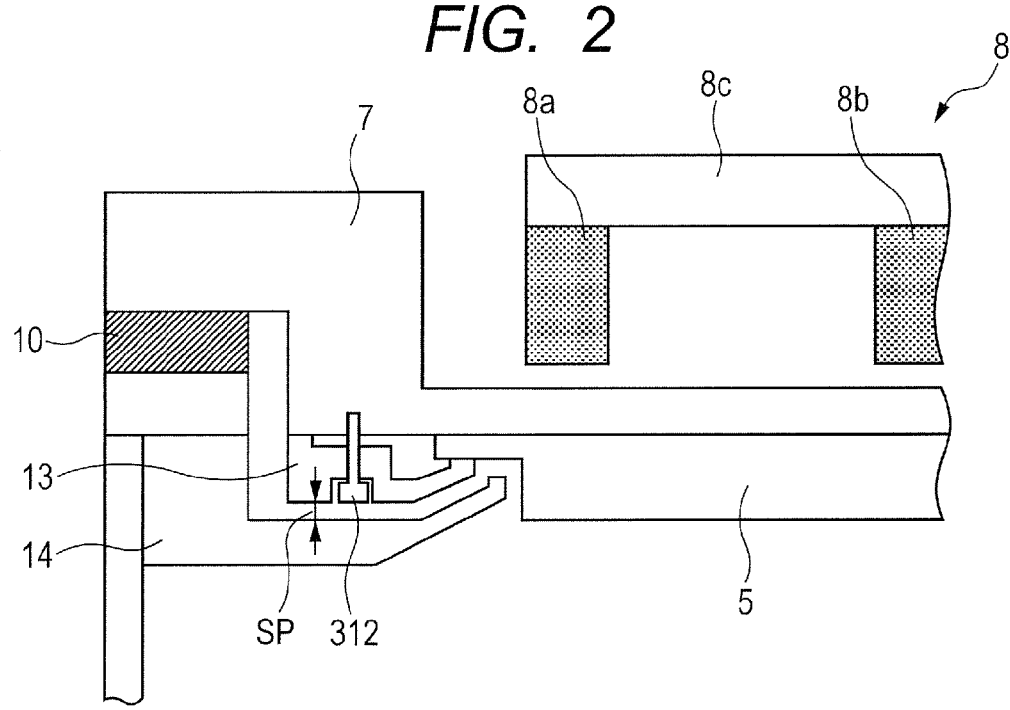
FIG. 2 is a diagram illustrating the basic configuration of an area around a target in the sputtering apparatus in the embodiment of the present invention.
Figure 5:
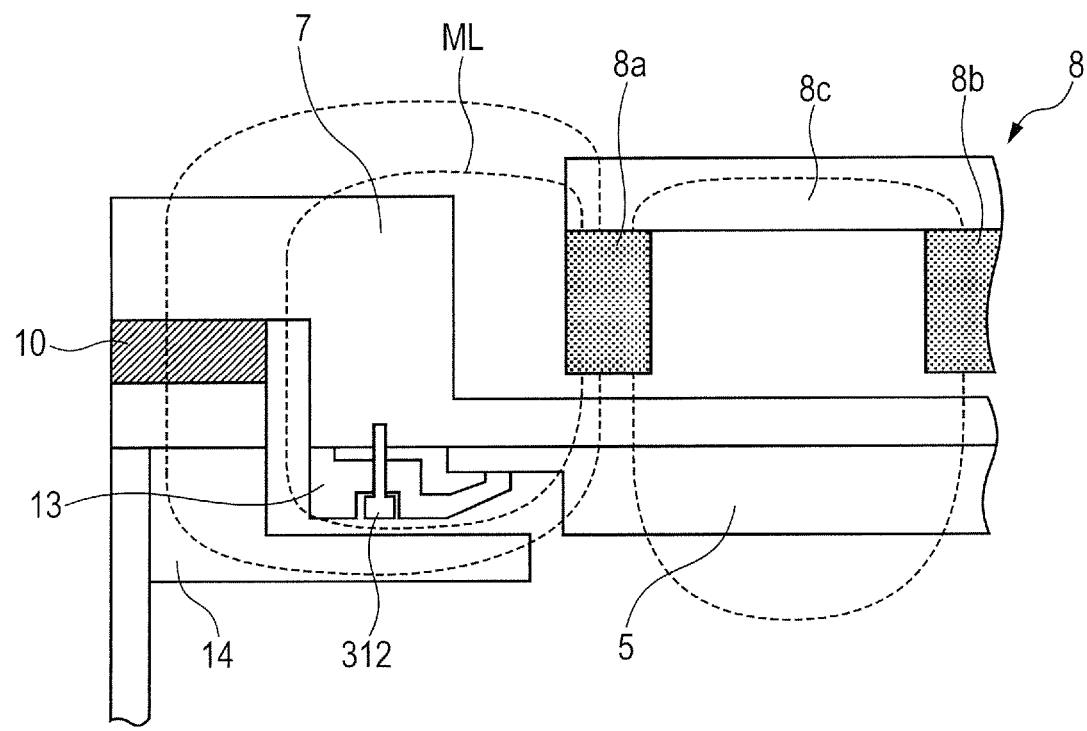
FIG. 5 is a diagram for explaining a problem.

Hereinafter, the sputtering apparatus in a first embodiment of the present invention will be described in detail with reference to FIG. 2 in addition to FIG. 1. The back surface side (the side of the backing plate 7 opposite to the side on which the target 5 is disposed) of the backing plate 7 is provided with the magnetron unit 8 that serves as a magnetic field generating means. The magnetron unit 8 includes an outside magnet 8a that is an annular permanent magnet, and an inside magnet 8b that is a permanent magnet provided inwardly of the outside magnet 8a. The outside magnet 8a and the inside magnet 8b are provided on a yoke 8c. Also, the outside magnet 8a and the inside magnet 8b are magnetized in a direction perpendicular to the target mounting surface of the backing plate 7. In FIG. 5, the surface of the outside magnet 8a facing the backing plate 7 is magnetized to the N pole. On the other hand, the inside magnet 8b is magnetized in the direction opposite to the magnetized direction of the outside magnet 8a, and the surface of the inside magnet 8b facing the backing plate 7 is magnetized to the S pole. The magnetron unit 8 is rotatably formed in a direction in the surface of the target 5. As the magnetron unit 8, the one disclosed in, for instance, Japanese Patent Application Laid-Open No. 2-107766 is preferably used.

Also, it is desirable in a sputtering apparatus that an erosion area on the surface (the surface facing the substrate S) of the target 5 be as large as possible and target utilization efficiency be improved. For this reason, it is desirable that the outer circumference of the outside magnet 8a and the outer circumference of to be sputtered surface of the target 5 be substantially on the same plane in the magnetized direction of the outside magnet 8a. In the case where the magnetron unit 8 is formed asymmetry with respect to a rotation axis (the outside magnet 8a and the inside magnet 8b are disposed asymmetrically with respect to the rotation axis), it is sufficient that the outermost circumference of the outside magnet 8a in rotational orbit and the outer circumference of to be sputtered surface of the target 5 be formed on the same plane.

Figure 3:
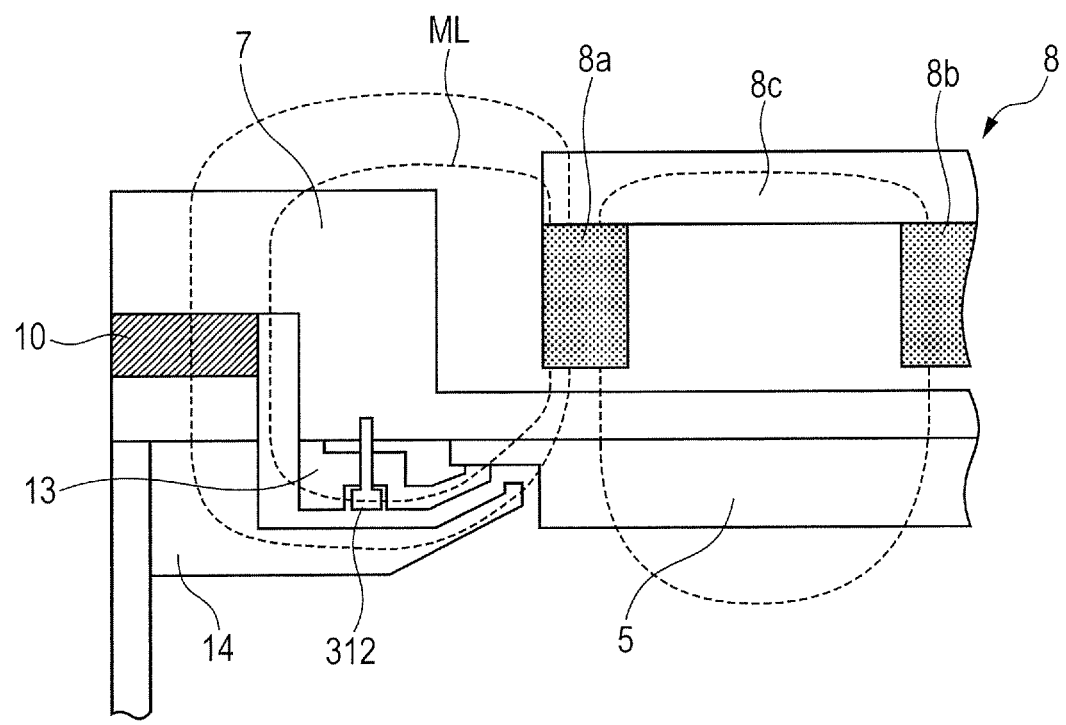
FIG. 3 is a diagram illustrating the basic configuration of an area around a target in the sputtering apparatus in the embodiment of the present invention.

Here, the shield 14 and the fixation part 13 as the features of the present invention will be described. In the present embodiment, the shield 14 and the fixation part 13 are made of a magnetic material. FIG. 3 schematically illustrates a magnetic field when the shield 14 and the fixation part 13 are made of a magnetic material. Magnetic field lines ML, which come out of the outside magnet 8a and move in the outer circumferential direction of the target 5, flow into the shield 14 or the fixation part 13, and the magnetic field lines ML hardly flow through a space SP between the fixation part 13 and the shield 14. Therefore, it is possible to reduce ions which flow from a plasma into the space SP along the magnetic field lines ML and to restrict unintended discharge that is generated in the space SP, the plasma being formed near the target 5.

Figure 4:
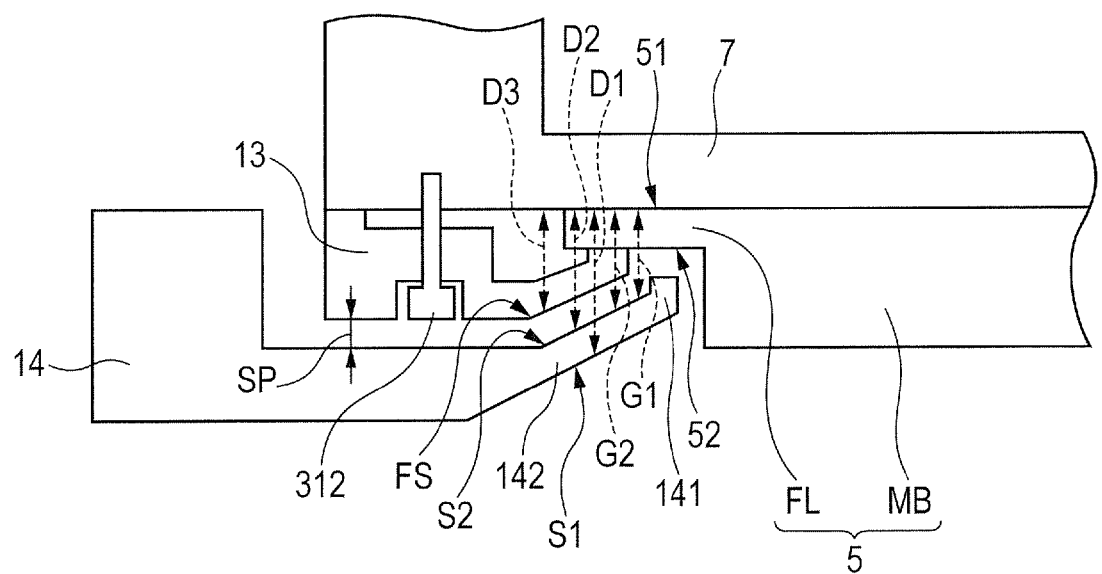
FIG. 4 is a diagram illustrating the basic configuration of an area around a target in the sputtering apparatus in the embodiment of the present invention.

Next, a more detailed structure of the sputtering apparatus according to the present embodiment will be described with reference to FIG. 4 in addition to FIGS. 1 and 2. The shield 14 has an opening OP. The target 5 has a main body MB disposed inside of the opening OP of the shield 14, and a flange FL that encloses the main body MB. The flange FL has a first face 51 and a second face 52, the first face 51 being a face facing the backing plate 7, the second face 52 being a face on opposite side to the first face 51. The fixation part 13 is configured to be able to fix the target 5 to the backing plate 7 by pressing the flange FL against the backing plate 7, the flange FL being a circumferential part of the target 5.

The shield 14 has a facing portion 141 and an outside portion 142 located outside the facing portion 141, the facing portion 141 facing the backing plate 7 without the fixation part 13 interposed in between. That is, the facing portion 141 is provided so that the fixation part 13 is not located between the facing portion 141 and the backing plate 7. Here, the outside portion 142 is disposed outside the facing portion 141 with respect to the opening OP. It is preferable that a gap G1 between the facing portion 141 facing the backing plate 7 without the fixation part 13 interposed in between and the backing plate 7 be smaller than a gap G2 between the outside portion 142 and the backing plate 7. This is effective in letting the magnetic field lines from the outside magnet 8a flow into the shield 14 easily, for instance, by placing the facing portion 141 which is the distal end of the shield 14 closer to the outside magnet 8a. Here, if the target 5 is mounted on the backing plate 7 by the fixation part 13, the facing portion 141 denotes a portion which faces the backing plate 7 without the fixation part 13 interposed in between in a state where the target 5 is removed.

In addition, an inner face S1 of the shield 14 facing the process space 12, that is, the inner face S1 on the side of the substrate holding unit 4 preferably includes an inclined portion (hereinafter, a first inclined portion) in which a distance D1 between the inner face S1 and the backing plate 7 gradually decreases from the outside portion 142 toward the facing portion 141. Here, in a cross section as illustrated in FIG. 2, the first inclined portion may be a linearly inclined portion or may be an inclined portion to form a curve. With the face S1 inclined, it is possible to restrict deposition of the particles on the face S1 which are sputtered from the target 5.

Further, a face FS of the fixation part 13 facing the process space 12 preferably includes an inclined portion (hereinafter, a second inclined portion) in which a distance D3 between the face FS and the backing plate 7 gradually decreases toward the inside of the opening OP of the shield 14 (that is, from an outer circumferential portion toward a central portion of the fixation part 13). Also, a face S2 on opposite side to the inner face S1 of the shield 14, that is, the face S2 facing the fixation part 13 preferably includes an inclined portion (hereinafter, a third inclined portion) in which a distance D2 between the face S2 and the backing plate 7 gradually decreases from the outside portion 142 toward the facing portion 141. The fixation part 13 is provided with the second inclined portion and the face S2 of the shield 14 facing the second inclined portion is provided with the third inclined portion in this manner, thereby enabling the facing portion 141 of the shield 14 to be closer to the backing plate 7 or the flange FL of the target 5. This allows the facing portion 141 to be even closer to the outside magnet 8a and allows the magnetic field lines from the outside magnet 8a to flow into the shield 14 easily. Also, the face FS of the fixation part 13 is inclined as well as the face S2 of the shield 14 is inclined, thereby making it possible to dispose the face S2 along the magnetic field formed by the magnetron unit 8. Therefore, it is possible to restrict the magnetic field lines that once enter the shield 14 from leaking to the space SP.

In order to further reduce the magnetic field lines ML that enter the space SP, it is desirable that the facing portion 141 which is the distal end of the shield 14 be located closer to the center of the target 5 than the fixation part 13 is. This is for the purpose of efficiently flowing magnetic field lines into the shield 14, the magnetic field lines flowing out from the outside magnet 8a and not flowing in the inside magnet 8b. As a result, it is possible to further reduce the magnetic field lines that enter the space SP.

Furthermore, composing the fixation part 13 of a magnetic material allows the magnetic field lines flowing out from the outside magnet 8a and not flowing in the inside magnet 8b to flow into the shield 14 and the fixation part 13. As a result, spread of magnetic field in the vicinity of the target can be restricted and magnetic field lines can be concentrated in a vertical direction to the target, and the plasma density in the vicinity of the target can be improved, thereby achieving improvement of film formation rate.

In addition, it is desirable that the fixation part 13 and the facing portion 141 of the shield 14 be provided so as not to face the magnetron unit 8 in a direction perpendicular to the target mounting surface of the backing plate 7. With such a structure, the shape of the magnetic tunnel formed by the outside magnet 8a and the inside magnet 8b can be favorably maintained, and the magnetic field lines flowing out from the outside magnet 8a and not flowing in the inside magnet 8b can be efficiently flowed into the shield 14 and the fixation part 13, and the magnetic field lines which enter the space SP can be reduced.

Although the shield 14 and the fixation part 13 are composed of a magnetic material in the present embodiment, the present invention is not limited to this, and the shield 14 and the fixation part 13 may be composed of a combination of a non-magnetic member and a magnetic member. For instance, the side of the shield 14 facing the process space, that is, the side facing the substrate holding unit 4 may be composed of a non-magnetic member, the side of the shield 14 facing the fixation part 13 may be composed of a magnetic member, and the shield 14 may be formed in a combination of these members. Otherwise, the side of the shield 14 facing the process space, that is, the side facing the substrate holding unit 4 and the side of the shield 14 facing the fixation part 13 may be composed of respective non-magnetic members and a magnetic member may be provided between these members to form the shield 14. So is the case with the fixation part 13, and for instance, the side of the fixation part 13 facing the shield 14 may be composed of a non-magnetic member, and the side of the fixation part 13 facing the backing plate 7 may be composed of a magnetic member.

Preferably, the shield 14 is formed by coating a non-magnetic metal film over a magnetic base material. It is desirable to perform the coating on at least the area of the shield 14 facing the process space, that is, the area facing the substrate holding unit 4. Metal film coating can be formed by thermally spraying Al or the like. With such a configuration, when the shield 14 is cleaned, a deposition film adhering to the shield 14 is exfoliated for each coating film, thereby enabling easy cleaning while reducing damage to the base material. So is the case with the fixation part 13, which may be formed by coating a metal film over a magnetic base material.

In either embodiment, the gist of the present invention is that the magnetron unit 8, and the shield 14 including a magnetic material and the fixation part 13 including a magnetic material are magnetically bonded together, and the magnetic field lines, which pass through the space SP between the shield 14 and the fixation part 13, are reduced compared with the case where the fixation part is non-magnetic. Particularly, such a problem of discharge in the space SP due to the magnetic field lines entering the space SP is conspicuous in high-density ionization sputtering using a high frequency. Therefore, the present invention is effective particularly to magnetron sputtering using a high frequency.

Also, the target 5 may be bonded to the backing plate 7 without using the fixation part 13 and a magnetic member may be provided around the target 5 instead. Also in this case, so is the case of the fixation part 13, the magnetic field lines which pass through the space SP can be reduced.

EXAMPLE

For the target 5, a target material may be used such as a pure metal (for instance, titanium) or an alloy (for instance, alloy of aluminum and copper), a magnetic material (for instance, Co), a dielectric material (for instance, SiO2), for instance. The target 5 is fixed to the backing plate 7 by the fixation part 13 so that the contact face of the target 5 comes into contact with the contact face of the backing plate 7. The backing plate 7 may be made of, for instance, a high thermally conductive material such as an oxygen-free copper. In the target 5, for instance, the outer diameter of the flange FL may be 180 mm, the thickness of the flange FL may be 3 mm, the outer diameter of the main body (to be sputtered portion) MB may be 160 mm, and the thickness of the main body MB may be 14 mm.

The fixation part 13 is made of SUS440C, for instance. An angle A (see FIG. 4) between the second inclined portion and a plane parallel to the contact face (this is typically parallel to the contact face of the target 5, the first face 51 and the second face 52 of the flange FL of the target 5) of the backing plate 7 is preferably an angle of degrees to 60 degrees, for instance, and may be 30 degrees, for instance, the second inclined portion being in the face FS of the fixation part 13 facing the process space 12.

The shield 14 is made of SUS440C, for instance. The first inclined portion in the inner face S1 of the shield 14, facing the process space 12 and the third inclined portion in the face S2 on the opposite side may be parallel to, for instance, the second inclined portion in the face FS of the fixation part 13 facing the process space 12. For instance, a gap of 1 mm to 2 mm may be provided between the fixation part 13 and the shield 14 to prevent arc discharge and generation of plasma. The facing portion 141 and the outside portion 142 of the shield 14 preferably have a thickness of 6 mm or greater, for instance.

The space between a face of the facing portion 141 closest to the flange FL and the flange FL may be 1 mm to 2 mm, for instance. The space between the inner side portion of the facing portion 141 of the shield 14 and the lateral face of the main body MB of the target 5 may be 1 mm to 2 mm, for instance.

The invention claimed is:

1. A sputtering apparatus comprising:
a substrate holding unit configured to hold a substrate;
a backing plate having a target mounting surface where to hold a target;
a power supply connected to the backing plate;
a magnet disposed on a side of the backing plate opposite to the target mounting surface of the backing plate;
a shield containing a magnetic material, being grounded, and surrounding the target mounting surface; and
a magnetic member located between the shield and the backing plate at an outer circumference of the target mounting surface, and provided at a position not facing the magnet in a direction perpendicular to the target mounting surface.

2. The sputtering apparatus according to claim 1,
wherein the magnetic member is configured to be able to fix the target to the backing plate,
the shield includes a facing portion and an outside portion located outside the facing portion, the facing portion facing the backing plate without the magnetic member interposed in between,
a gap between the facing portion and the backing plate is smaller than a gap between the outside portion and the backing plate, and
an inner face of the shield on a side facing the substrate holding unit includes a first inclined portion in which a distance between the inner face and the backing plate gradually decreases from the outside portion toward the facing portion.

3. The sputtering apparatus according to claim 2,
wherein a face of the magnetic member on a side facing the substrate holding unit includes a second inclined portion in which a distance between the face and the backing plate gradually decreases from an outer circumferential portion toward a central portion of the magnetic member, and
an opposite face of the shield on an opposite side to the inner face of the shield includes a third inclined portion in which a distance between the opposite face and the backing plate gradually decreases from the outside portion toward the facing portion.

4. The sputtering apparatus according to claim 1, wherein the power supply is a high frequency power supply.

5. The sputtering apparatus according to claim 1,
wherein the magnet is provided on a yoke, and
the magnet includes an annular outside magnet and an inside magnet, the annular outside magnet being magnetized in a direction perpendicular to the target mounting surface, the inside magnet being magnetized in a direction opposite to the magnetized direction of the outside magnet.

* * * * *